US006458430B1

(12) United States Patent
Bernstein et al.

(10) Patent No.: US 6,458,430 B1
(45) Date of Patent: Oct. 1, 2002

(54) PRETREATMENT PROCESS FOR PLASMA IMMERSION ION IMPLANTATION

(75) Inventors: James D. Bernstein, Beverly; Peter L. Kellerman, Essex; Alec S. Denholm, Lincoln, all of MA (US)

(73) Assignee: Axcelis Technologies, Inc., Beverly, MA (US)

(*) Notice: Subject to any disclaimer, the term of this patent is extended or adjusted under 35 U.S.C. 154(b) by 0 days.

(21) Appl. No.: 09/469,661

(22) Filed: Dec. 22, 1999

(51) Int. Cl.[7] .......................... C23C 14/48; C23C 16/04
(52) U.S. Cl. ....................... 427/525; 427/526; 427/531; 427/534; 438/514; 438/520; 438/528; 438/531
(58) Field of Search ................................ 427/524, 525, 427/526, 527, 531, 534, 491, 504, 552, 536; 438/514, 515, 520, 527, 528, 531

(56) References Cited

U.S. PATENT DOCUMENTS

| | | | | |
|---|---|---|---|---|
| 3,908,183 A | * | 9/1975 | Ennis, Jr. | |
| 4,096,315 A | * | 6/1978 | Kubacki | |
| 4,119,688 A | * | 10/1978 | Hiraoka | |
| 4,239,787 A | * | 12/1980 | Rentschler | |
| 4,680,474 A | | 7/1987 | Turner et al. | |
| 4,764,394 A | | 8/1988 | Conrad | |
| 4,851,691 A | | 7/1989 | Hanley | |
| 5,003,178 A | * | 3/1991 | Livesay | 250/492.3 |
| 5,354,381 A | | 10/1994 | Sheng | |
| 5,607,509 A | | 3/1997 | Schumacher et al. | |
| 5,654,043 A | * | 8/1997 | Shao et al. | 427/523 |
| 5,711,812 A | | 1/1998 | Chapek et al. | |
| 5,858,623 A | | 1/1999 | Yu et al. | |
| 5,965,034 A | | 10/1999 | Vinogradov et al. | |
| 5,969,398 A | * | 10/1999 | Murakami | 438/523 |
| 5,988,103 A | | 11/1999 | Fetherston et al. | |
| 6,143,631 A | * | 11/2000 | Chapek | 438/528 |
| 6,200,873 B1 | * | 3/2001 | Schrems et al. | 438/526 |

FOREIGN PATENT DOCUMENTS

| | | |
|---|---|---|
| DE | 197 50 9009 C1 | 11/1997 |
| WO | WO 99/06110 | 7/1997 |
| WO | WO 01/15200 A1 | 3/2001 |

OTHER PUBLICATIONS

1999 Copyright notice for the 1998 International Conference on Ion Implantation Technology Proceedings, Institute of Electrical and Electronics Engineers, Inc., No Month.
OhioLINK Research Database web page dated Aug. 1, 2001 of Bernstein, "Photoresist integrity," Proceedings of the International Conference on Ion Implantation Technology, vol. 2, 1999.
William Reass, Los Alamos National Lab, Los Alamos, NM, 87545, publication date: Jun. 21, 1993, "Optimal Pulse–Modulator Design Criteria for Plasma Source Ion Implanters", pp. 1–4.
Bernstein, Whiteside, Rendon, *Photoresist Integrity and Outgassing Effects During Plasma Immersion Ion Implantation*, 1998 International Conference on Ion Implantation Technology Proceedings, pp. 1207–1210 (IEEE 1999). No Month.

* cited by examiner

*Primary Examiner*—Marianne Padgett
(74) *Attorney, Agent, or Firm*—Watts, Hoffmann, Fisher & Heinke Co., L.P.A.

(57) ABSTRACT

A method for use with a plasma immersion ion implantations systems wherein a substrate W having a patterned photoresist P thereon is implanted. The method includes ionizing a first gas in a chamber 12 to produce electrically inactive ions and reacting the electrically active ions with the photoresist P to produce outgassing 64. The outgassed material 64 is continuously evacuated until outgassing is substantially completed. The method further includes ionizing a second gas to produce electrically active ions and implanting a positively charged species of the electrically active ions into the substrate. Also disclosed is a method for curing the photoresist prior to ion implantation. A gas is ionized in the chamber 12 to produce positively and electrons. The electrons are first attracted to a substrate in the chamber having patterned photoresist P thereon for hardening the photoresist. The positively charged ions are then implanted into substrate W wherein photoresist outgassing is substantially prevented.

20 Claims, 4 Drawing Sheets

GENERATE PLASMA OF ELECTRICALLY INACTIVE IONS

PERIODICALLY PULSE WITH NEGATIVE VOLTAGE AND EVACUATE TO REMOVE OUTGAS MATERIAL

GENERATE PLASMA OF ELECTRICALLY ACTIVE IONS

PERIODICALLY PULSE WITH NEGATIVE VOLTAGE. CLOSED SYSTEM

GENERATE ELECTRICALLY ACTIVE IONS

PERIODICALLY PULSE WITH POSITIVE VOLTAGE

PERIODICALLY PULSE WITH NEGATIVE VOLTAGE

PRETREATMENT PROCESS FOR PLASMA IMMERSION ION IMPLANTATION

FIELD OF THE INVENTION

The present invention relates generally to plasma immersion ion implantation. In particular, the present invention is directed to a process for minimizing ion implantation of undesired species and enhancing the stability and repeatability of desired dopant ions.

BACKGROUND OF THE INVENTION

Ion implantation is a widely used technology preferred in the industry for doping semiconductor wafer work pieces. Generally, an ion beam implanter generates a beam of ions in a source chamber which are then directed with varying degrees of acceleration toward the work piece. The beam of ions is comprised of positively charged ions that impinge upon an exposed surface of a semiconductor wafer work piece thereby "doping" or implanting the work piece surface with ions. The advantage to this process is that the user can selectively determine which ions are implanted by careful selection of an ionizable source gas.

A conventional ion implanter generally comprises three sections or subsystems: (i) an ion source for outputting an ion beam, ii) a beamline including a mass analysis magnet for mass resolving the ion beam, and (iii) a target chamber which contains the semiconductor wafer work piece to be implanted by the ion beam. The entire region between the ion source and the semiconductor wafer work piece is maintained at high vacuum to prevent formation of neutrals by collision of beam ions with residual gas molecules.

Ion sources in conventional ion implanters typically generate an ion beam by ionizing a source gas within a source chamber to produce a plasma at pressures of about $10^{-3}$ to $10^{-5}$ torr. Generally, the plasma is formed through collision of the source gas with electrons from an arc discharge, or cold cathode source. Typical examples of source gases include arsine ($AsH_3$), vaporized antimony (Sb), phosphine ($PH_3$), diborane ($B_2H_6$), boron trifluoride or trichloride ($BF_3$ or $BCl_3$), silicon tetrachloride ($SiCl_4$), vaporized gallium (Ga), vaporized indium (In), ammonia ($NH_3$), hydrogen ($H_2$) and Nitrogen ($N_2$). Positively charged ions are discharged from the ion source and directed along an evacuated beam path provided by the beam line toward the target chamber.

The ion beam produced in the ion source chamber is mass filtered such that substantially only the desired dopant species enter the target chamber. For example, ionized $BF_3$ gas will dissociate into $B^{++}$, $B^+$ and $BF_2^+$ after collision with electrons from an arc discharge. The separation of ions by mass analysis is performed by adjusting a magnetic field about the beam line as the ions are discharged from the ion source. As the ions travel through the magnetic field, the strength and direction of the magnetic field of the analyzing magnet is set such that only ion species with a proper atomic weight, i.e., $B^+$, are deflected at a proper radius of curvature to follow the desired beam line path to the target chamber. Thus, the undesired ions, i.e., $B^{++}$ and $BF_2^+$, will be substantially filtered and prevented from reaching the target chamber. After filtration, the desired dopant ions are typically accelerated to the target chamber. Once in the target chamber, the desired dopant ions within the beam line strike the work piece and are implanted therein. Beam energies for conventional ion implantation generally range from 2–30 keV for low energy implanters to several MeV for high energy implanters.

Plasma immersion ion implantation (PIII) is an emerging technology that differs from the conventional ion implantation previously described in that the work piece to be selectively doped with ions is immersed within a plasma in the target chamber. Thus, unlike conventional ion implantation, the target chamber of plasma immersion ion implanters functions as both the processing chamber and the plasma source. Accordingly, PIII systems do not have mass filtering magnets for separating mass ions. Advantageously, this allows plasma immersion implantation of ions to occur at higher dose rates with much lower energies than that typically observed with conventional ion implantation. Typical energies employed in PIII systems range from about 0.1 KeV to about 10 KeV. Higher dose rates translate directly to increased throughput whereas lower energies minimize implant damage.

In a typical PIII system, a voltage differential is periodically established between a plasma and a platen holding the work piece to attract ions generated in the plasma toward the work piece. An ionizable gas is continuously fed into the chamber and subsequently ionized by an electromagnetic energy, either inductively or capacitively coupled, to form the plasma. A sufficient voltage differential will result in a pulsed ion implantation into the surface of the work piece. However, since the entire work piece is exposed to the plasma, all material exposed therein including any outgassed photoresist byproducts, may become ionized by the plasma and undesirably implanted into the wafer. Thus, there is no mass discrimination as is the case with conventional ion implantation wherein generation of ions occur in an ion source chamber spaced apart from the target chamber and are subsequently mass filtered prior to implantation into the work piece. Accordingly, it is important in PIII systems to keep the chamber free from materials that could come in contact with the plasma during operation, ionize and become implanted into the work piece.

The use of plasma immersion ion implantation presents significant problems since prior to ion implantation, an organic photoresist masking material is commonly used to protect areas of the work piece from ion implantation while allowing the charged ions to penetrate, or implant into the work piece in exposed regions to produce the desired doping characteristics in the work piece. Those skilled in the art will recognize and appreciate that as the charged ions impinge upon the work piece surfaces, the energetic ions react with the photoresist mask material to break bonds within the photoresist which subsequently results in outgassing of photoresist reaction by-products. As a result, outgassing of hydrogen, nitrogen, water vapor, hydrocarbons and other materials occur. The rate of outgassing is generally exponential. That is, outgassing is greatest during the initial bombardment of ions on the photoresist material and tapers off dramatically as implantation continues. In PIII systems, the outgassed material may then become exposed to the plasma and ionized resulting in, among others, implantation of undesired species that could affect the desired electrical properties for the work piece. Since most photoresists are organic, the photoresist outgas includes various hydrocarbons species. Of all species of the resist which outgas, carbon is of greatest concern during plasma immersion ion implantation since implanted carbon has been generally known to increase leakage currents and degrade generation lifetime in devices.

Additionally, in a manner similar to conventional ion implantation, the outgassed photoresist can cause pressure variations within the chamber which in turn can affect the quantity of impurity dopants implanted since measurement of implantation dose is essentially the same in PIII and conventional ion implanters. It is believed that the outgassing of photoresist can cause pressure gradients across the wafer, thereby influencing plasma density and doping rate across the wafer.

Moreover, ion implantation in general, is known to cause degradation of critical dimensions (CD) in the photoresist mask which can lead to a decrease in the yields of high end devices. For example, high energy and high current ion implantation can cause blistering, reticulation, burning and thermal flow of the resist, thereby effecting critical dimensions As such, subsequent etching or implant processes may result in etching or implanting into undesired areas of the underlying substrate.

Prior art approaches to the problems associated with photoresist outgassing during ion implantation generally focussed on making the resist more resistant to outgassing prior to implantation or etching. For example, hardening the photoresist prior to ion implantation is known to minimize outgassing and can be achieved by UV curing, e-beam curing, hard baking or a combination thereof However, these processes require additional time and different equipment sets, which in turn adds to the overall cost and throughput of the manufactured devices.

Accordingly, there is a need for improved methods for use with plasma ion immersion implantation to minimize the deleterious effects of photoresist outgassing. Additionally, it would be desirable if during plasma ion immersion implantation that the resist could be hardened in situ to minimize outgassing of the resist during ion implantation.

SUMMARY OF THE INVENTION

The present invention is directed to methods for use with a plasma immersion ion implantation (PIII) system wherein dopant ions implant into a surface of a substrate having an organic photoresist mask thereon. The present invention overcomes problems associated with photoresist outgassing occurring as a result of plasma immersion ion implantation. Moreover, the present invention addresses problems unique to plasma immersion ion implantation, i.e., ionization by the implant plasma of any material exposed therein such as photoresist outgas.

In one embodiment, the PIII process includes placing the substrate having the organic photoresist mask thereon into a process chamber and pretreating the substrate prior to the steps of generating the implant plasma so as to substantially prevent implantation of undesired ions resulting from a reaction of the implant ions with the photoresist. Preferably, the substrate is a silicon semiconductor wafer. The pretreatment steps includes generating a plasma from an ionizable source to produce electrically inactive ions or electrons. The electrically inactive ions produced in the plasma react with the organic photoresist mask to cause outgassing. The outgas material is removed by evacuating. Preferably, the evacuation is performed as the outgassing material evolves from the wafer. Advantageously, this prevents subsequent implantation of any undesired species that may occur during the implant process steps. The source for the ionizable gas in the pretreatment process is a selected one of a noble gas and vaporizable material. Preferably, the noble gas is selected from the group consisting of helium, neon and argon and flows into the chamber at a rate greater than 50 sccm. The high flow rate and pumping speed cause the outgassed photoresist to have a small partial pressure and therefore contribute very little to the implant. In the case of argon, the electrically inactive species implanted into the substrate are $_{40}Ar^+$. Preferably, the pretreatment steps are completed in less than about 10 seconds. The optical emission signal of carbon species produced during the outgassing may be monitored for determining when the carbon emission signal is no longer detectable. The steps of implanting electrically active ions doccurs once the outgassing is substantially complete or when the emission signal of carbon ions is no longer detectable.

An implant plasma of ions from an ionizable source is generated in a chamber wherein the pretreated substrate having the patterned photoresist thereon is implanted with electrically active ions when implanted. Voltage pulses are applied between the chamber walls and the substrate independently of the forming of the plasma for selectively attracting and implanting the electrically active ions into a surface of the substrate. Preferably, the source for the implant plasma is an ionizable gas and flows into the chamber at a rate of about 0.5 sccm to about 10 sccm. Preferably, the source for the ionizable gas is selected from the group consisting of arsine, vaporized antimony, phosphine, diborane, boron trifluoride or trichloride, silicon tetrachloride, vaporized gallium, vaporized indium, ammonia, hydrogen and nitrogen.

In another embodiment the process for use with PIII systems include the following sequence of steps:

a) placing the substrate having an organic photoresist pattern thereon into a chamber;

b) flowing a first ionizable gas into the chamber;

c) ionizing the first gas in the chamber to produce electrically inactive ions when implanted in the substrate;

d) reacting the electrically inactive ions with the photoresist to produce an outgas material and continuously evacuating the outgassed material from the chamber so as to substantially prevent ionizing the outgassed material;

e) turning off the flow of the first gas;

f) flowing a second gas into the chamber;

g) ionizing the second gas in the chamber to produce electrically active ions;

h) selectively implanting the electrically active ions into the substrate surface;

i) turning off the second gas flow; and j) unloading the substrate from the chamber.

In another embodiment, a process for curing the photoresist prior to ion implantation is disclosed. The process includes placing a substrate having an organic photoresist patterned thereon in an evacuated chamber. A gas is ionized to produce positive ions and electrons. A positive voltage pulse on the platen attracts and accelerates electrons to the substrate. This electron processing cures the photoresist making it more resistant to damage during subsequent processing.

Further features and advantages of the present invention will become apparent from the following detailed description and accompanying drawings which form a part of the specification.

DETAILED DESCRIPTION OF A PREFERRED EMBODIMENT

The present invention is directed to methods for use with plasma immersion ion implanters wherein dopant ions are implanted into a substrate surface having thereon a photoresist mask. The inventive methods minimize the effects of photoresist outgassing that can occur during ion implantation. The methods generally include generating a plasma of electrically inactive ions and reacting the electrically inactive ions with the substrate. In particular, the method includes reacting the electrically inactive ions with the photoresist to cause outgassing prior to the steps of implanting desired dopant ions. The outgassed photoresist material is continuously evacuated from the process chamber during reaction with the electrically inactive ions to substantially prevent photoresist outgassing by a subsequent implant plasma. Accordingly, the process advantageously avoids implanting any outgassed photoresist species (ie., carbon) by the implant plasma. Moreover, the use of a source material that generates the electrically inactive ions, such as argon gas, is relatively inexpensive compared to source materials used for the implant plasma.

There is also disclosed herein a method for hardening a photoresist in the process chamber prior to ion implantation by plasma immersion ion implantation. As discussed previously, hardening the photoresist is known to minimize outgassing. In plasma immersion ion implantation, high voltage negative pulses are typically used to attract positively charged species in the implant plasma to the substrate for ion implantation. Applicant's have found that by reversing the polarity of the pulse voltage, electrons generated in the implant plasma can be attracted to the substrate. The electrons react with the photoresist to harden the photoresist and minimize outgassing during subsequent ion implantation. While not wanting to be bound by theory, it is generally believed that the electrons react with the photoresist to cause an increase in a crosslinking density of the resist so as to minimize free volume in the resist. As such, it has been found that a photoresist hardened in this manner is less reactive with the energetic positively charged ions produced during ion implantation and consequently, results in significantly less or no outgassing and improved photoresist immunity. Accordingly, the resist can be advantageously hardened in situ without the need for other specialized processing equipment. Thus, the inventive processes advantageously are cost effective compared to prior art alternatives.

Figure 1:
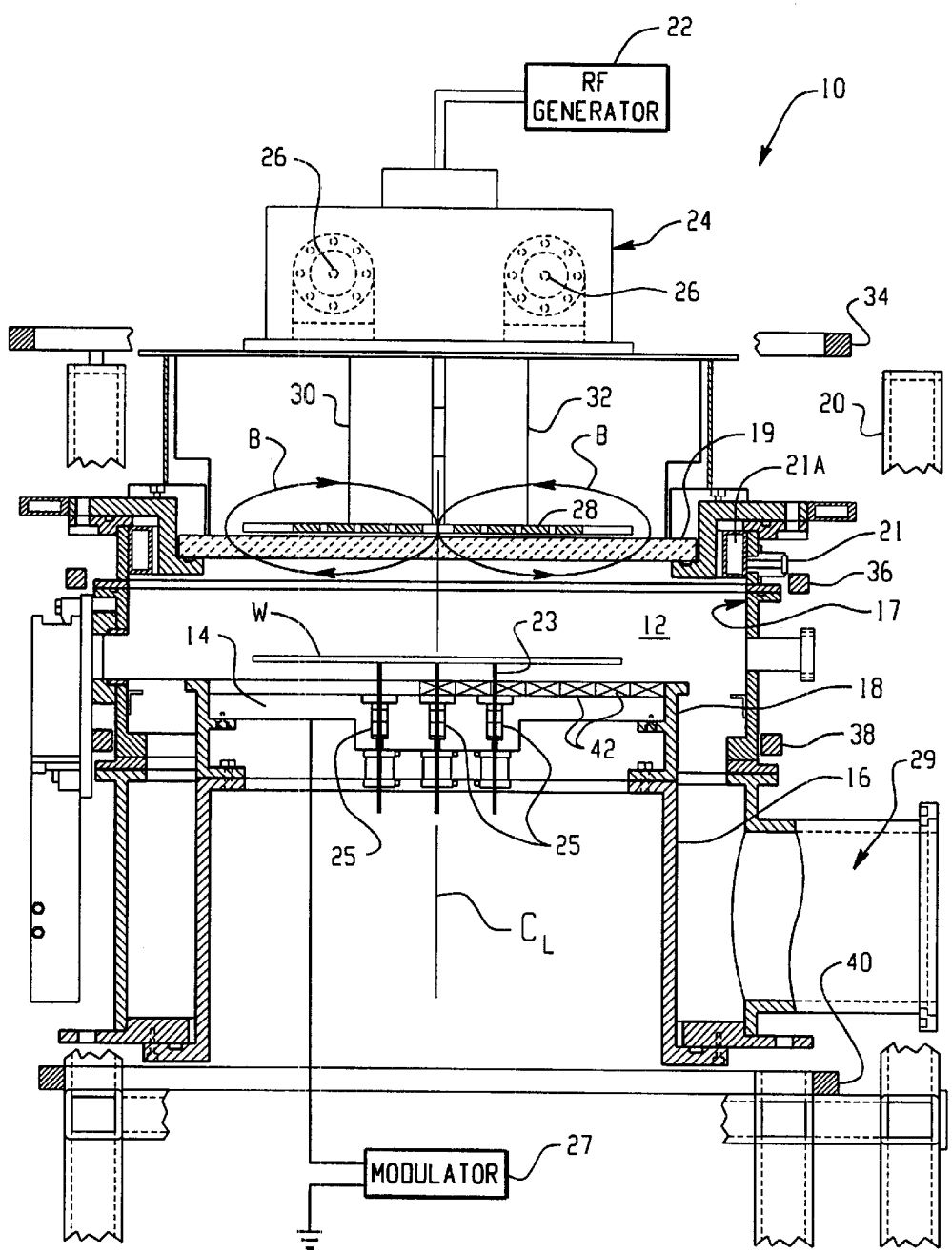
FIG. 1 is a cross sectional plan view of a plasma immersion ion implantation system suitable for use in the present invention.

Referring now to the drawings, and in particular to FIG. 1, there is shown a Plasma Immersion Ion Implanter, generally designated 10, that is suitable for use in the present invention. The invention is not limited to any particular plasma immersion ion implanter construction in this or in the following embodiments. The illustrated system 10 includes an evacuated process chamber 12 that is defined by an electrically activatable wafer support platen 14 mounted on insulator 18, an electrically grounded chamber housing 16 having conductive walls 17, and a quartz window 19. Plasma generated within the chamber contains ions of a desired dopant species that are implanted into a substrate, such as a semiconductor wafer W or the like, located therein, when a negatively charged voltage is applied to the platen 14. As shown in FIG. 1, the wafer W is lifted off of the platen by pins 23 operated by pin assemblies 25. In this manner, the wafer may be readily installed into and removed from the plasma chamber via a loadlock assembly (not shown).

The plasma is generated in the process chamber 12 as follows. An ionizable gas is introduced into the process chamber 12 by means of inlet 21 and perforated annular channel 21A that resides about the upper periphery of the chamber. A radio frequency (RF) generator 22 generates an RF signal (on the order of 13.5 megahertz (MHZ)) which is coupled to a matching network 24. The matching network includes capacitors 26 that capacitively couples the RF signal to a generally planar antenna 28, having inner and outer circular coils, via leads 30 and 32. Matching the impedance of the RF generator 22 with that of the load insures maximum power out the antenna 28 by minimizing reflection of the RF signal back to the generator. One such type of matching network is known as an "inverted L" network wherein the capacitance of capacitors 26 are varied by servomotors, depending upon the operating conditions.

The RF current generated within the antenna 28 creates a magnetic field that passes through the quartz window 19 into the process chamber 12. The magnetic field lines are oriented in the direction shown by arrows B, based on the direction of current through the antenna coils. The magnetic field penetrating the process chamber through the quartz window 19 induces an electric field in the process chamber. This electric field accelerates electrons, which in turn ionize the gas, which is introduced into the chamber through annular channel 21A, to create a plasma. Because the implantation process occurs in a vacuum, the process chamber 12 is evacuated by pumps (not shown) via pump manifold 29. A collecting lens (not shown) may be arranged outside and behind the window 19 to collect the emission spectra of the plasma during operation In this case, an optical emission spectrometer (not shown) is further arranged behind the lens.

Electromagnetic coils 34, 36, 38 and 40 are located outside of the process chamber 12. The purpose of the coils is to vary the magnetic field within the process chamber 12 to effectively vary the plasma diffusion rate, which varies the radial distribution of plasma density across the surface of the wafer, to insure a uniform implant across the wafer surface. The electromagnetic coils includes two larger main coils 34 and 40 disposed above and below respectively, two smaller trim coils 36 and 38, which reside closer in proximity to he process chamber 12. In addition, the wafer platen 14 includes a dosimetry detector such as a plurality of Faraday current collectors or cups 42 that are used to measure plasma current density and thereby provide an indication of implant dose.

Figure 2:
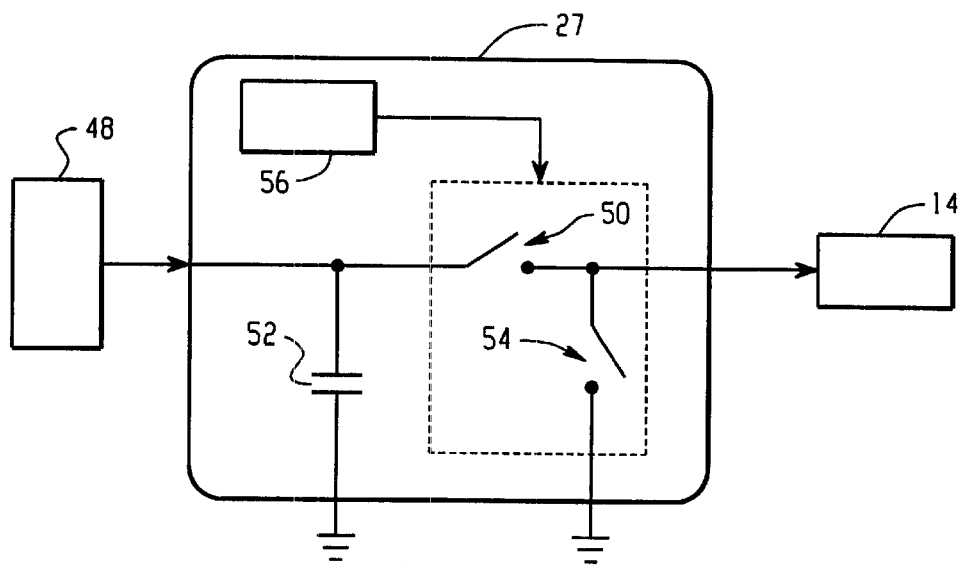
FIG. 2 is a block diagram of a platen voltage controller that includes the modulator switching mechanism shown in FIG. 1.

The modulator 27 includes a mechanism for controlling the voltage applied to the wafer platen 14. As shown in FIG. 2, the platen voltage controlling mechanism includes the modulator 27 and a high power voltage supply 48. Switch 50 is used to periodically apply or pulse a high negative voltage to the platen 14 to enable the implantation of positively charged ions in the plasma into the wafer W residing on the platen. Optionally, the modulator can include a transformer to allow the user to switch the polarity applied to the platen (i.e., by reversing the secondary leads of the transformer). Thus, a high positive pulse can be applied to the platen to enable reaction of the electrons in the plasma with a photoresist mask material on the wafer. This results in curing or hardening the photoresist material prior to the ion implantation with positively charged ions, thereby minimizing the outgassing effects that normally occur during implantation. Reversing the polarity so that negative pulses are periodically applied to the platen 14 will cause the positively charged ions to implant in the wafer. Capacitor 52 installed between earth ground and the power supply 48, serves as a buffer to suppress power supply voltage.

Switch 54 is connected between the platen 14 and a lesser potential (in this case earth ground) and used to limit the voltage applied to the platen 14 after the switch 50 opens. Switches 50 and 54 are preferably high voltage IGBT-type switches that are operated by controller 56. Controller 56 may also be used to control the voltage output by power supply 48. The use of switch 54 functions in a carefully controlled sequential manner to insure uniform implant energy distribution and minimize charge accumulation of a substrate implanted by system 10 such as that described in U.S. patent application No. 09/369,560, filed on Aug. 6, 1999 to Kellerman et al., herein incorporated by reference in its entirety.

The source material for ion implantation may include an ionizable gas or vaporized source material. Source material in solid form is deposited into a vaporizer which is then injected into the plasma. If an n type extrinsic wafer material is desired, boron (B), gallium (Ga) or indium (In) is commonly used. Gallium and indium are solid source materials, while boron is injected into the plasma chamber as a gas, typically as boron trifluoride ($BF_3$) or diborane ($B_2H_6$), because boron's vapor pressure is too low to result in a usable pressure by simply heating boron. If a p type extrinsic material is to be produced, suitable source materials include gases such as arsine ($AsH_3$) and phosphine ($PH_3$) and vaporized solid antimony (Sb).

Figure 3:
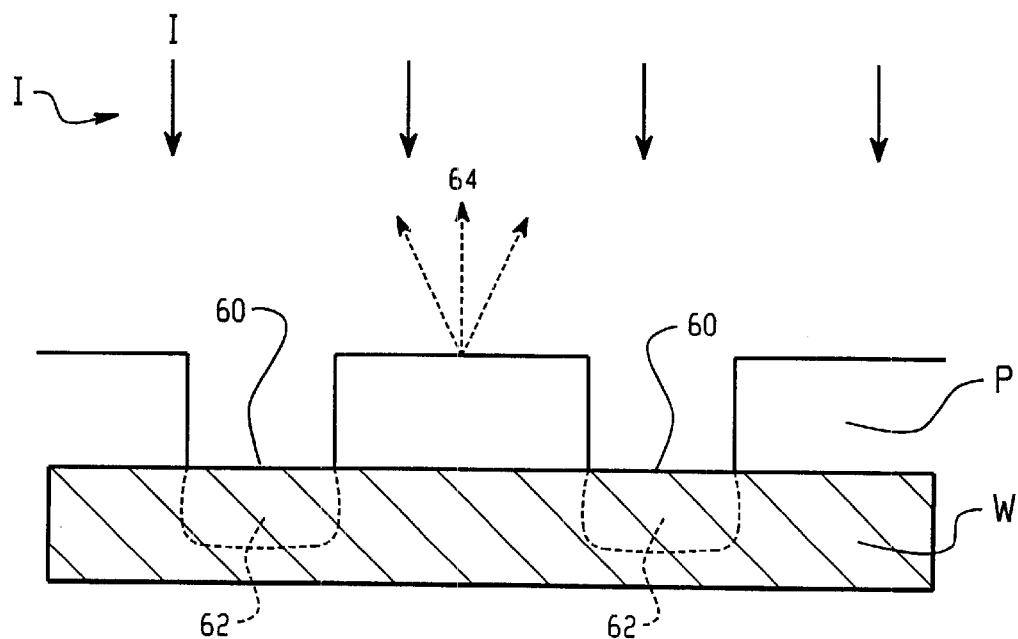
FIG. 3 is a partial cross sectional view of a semiconductor wafer and a patterned photoresist layer.
Figure 4A:
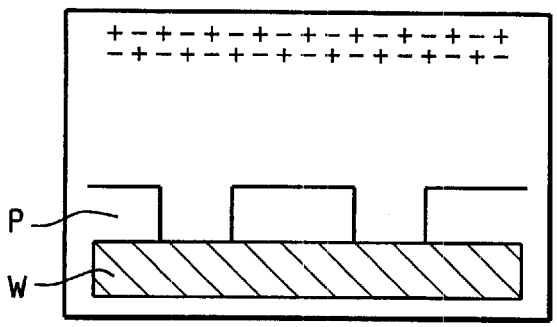
FIG. 4 is a schematic illustrating the sequence of steps for use with plasma immersion ion implantation in accordance with one embodiment of the invention.
Figure 4B:
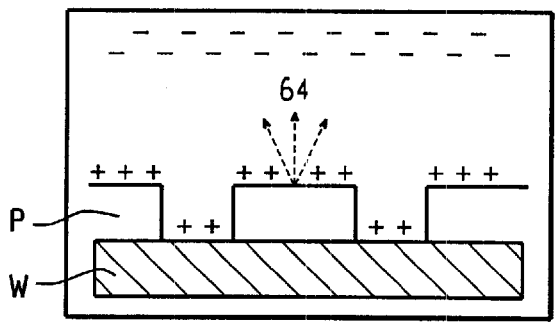
Figure 4C:
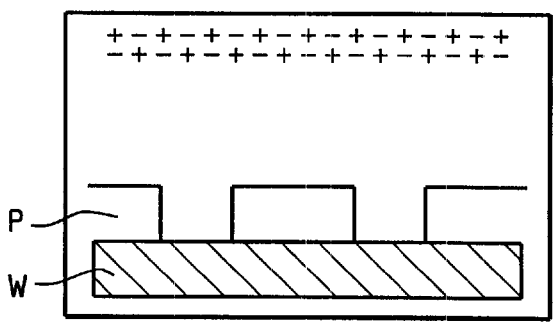
Figure 4D:
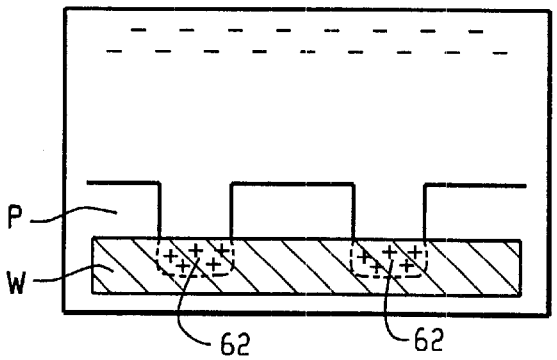

In FIG. 3, there is shown a cross sectional view of the wafer W having thereon a patterned photoresist layer P. The photoresist pattern, more commonly referred to as a mask, is used to protect areas of the wafer from ion implantation while allowing the positively charged ions to penetrate, or implant into the substrate in exposed surfaces 60 to produce the desired doping regions 62 in the wafer. In a typical PIII process, positively charged ions, generally indicated as I, are attracted to the wafer. The positively charged ions implant into the exposed areas of the wafer and react with the photoresist material to cause various chemical bonds in the photoresist to break resulting in the outgas of various species 64 from the surface of the photoresist and into the process chamber 12. The outgas species depends on the composition of the photoresist and includes but is not limited to, species such as water, nitrogen, carbon oxides and various hydrocarbons. If the outgassed material is exposed to the plasma, the outgassed species will become ionized after a period of time and deleteriously implant into the exposed areas of the wafer. Moreover, photoresist outgassing causes pressure variations within the chamber and can neutralize the desired positively charged implant ions which in turn affects the quantity of impurity dopants implanted.

Photoresists are generally organic photosensitive films used for transfer of images to an underlying substrate. The present invention is generally applicable to those organic photoresists used in g-line, i-line, DUV, 193 nm, and 157 nm applications or the like. This includes, but is not limited to, novolaks, polyvinylphenols, acrylates, and cyclic olefins. Other photoresist formulations will be apparent to those skilled in the art in view of this disclosure. The photoresist may be positive acting or negative acting depending on the photoresist chemistries and developers chosen. The photoresist is coated onto the wafer and patterned using conventional photolithographic methods.

A method of plasma ion immersion implantation in accordance with the present invention is shown schematically in FIG. 4 illustrating the sequence of steps for use with the plasma immersion ion implanter of FIG. 1. The process includes loading the wafer W having the photoresist pattern P thereon onto the platen 14 in the chamber 12. A first gas is then introduced into the chamber at a relatively high rate by means of the inlet 21 and perforated annular channel 21A. For example, the first gas flows into the process chamber at a rate of about 50 sccm or greater. The RF current is generated within the antenna 28 to induce an electric field in the process chamber. A throttle of the vacuum manifold 29 is left open for continuous evacuation. The pressure within the process chamber is maintained at a steady state which typically ranges from about 1 millitorr to about 100 millitorr. The electric field causes the first gas to ionize and form a plasma of electrically inactive ions when implanted into the wafer, as shown in step 1 of FIG. 4. The source materials of the first gas for producing electrically inactive ions include the noble gases such as argon, helium, neon and the like. Other gases suitable for use in the present invention for producing electrically inactive ions will be apparent to those skilled in the art in view of this disclosure. Argon is preferred since it is relatively inexpensive and readily available.

The platen 14 is then periodically negatively pulsed relative to the wails of the chamber so that positively charged ions of the ionized first gas, e.g. $_{40}Ar^+$, accelerate normally to the surface of the wafer on the platen as shown in step 2 of FIG. 4. The positively charged ions react with the photoresist to cause scission of chemical bonds in the photoresist material resulting in outgassing of photoresist species 64. Continuous evacuation by the vacuum pump removes the outgassed material as it evolves from the wafer such that the outgassed material is not ionized by the plasma. Once the outgassing is substantially completed, the RF current and first gas flow are turned off.

Monitoring the outgas material is conventionally performed by methods generally known to those skilled in the art, such as by optical emission spectroscopy. The emission spectra of the outgas material can be collected through the quartz window 19 in the process chamber 12. A collecting lens (not shown) may be arranged outside and behind the window to collect the emission spectra thus passed. The optical emission spectrometer (not shown) or other spectroscopic means can be further arranged behind the lens. In particular, the emission signal of carbon species can be monitored to accurately determine when outgassing is completed. The pre-ion implantation steps on the wafer last about 10 seconds at which time, the ion implantation process steps may begin.

For ion implantation to occur, the vacuum throttle is closed such that the pressure in the process chamber is at a constant steady state. Any deviation in pressure during implantation is generally known in the art of ion implantation to contribute to implant dosage errors. Moreover, dopant gases are relatively expensive and as such, a high efficiency dose rate is preferred. The RF current is generated to induce an electric field in the process chamber and the implant gas, e.g., $AsH_3$, flows at about 0.5 to about 10 sccm into the electric field in the process chamber to generate a plasma of electrically active ions as shown in step 3 of FIG. 4. A high negative pulse is periodically applied to the platen 14 to attract and implant the positively charged dopant ions into the surface of the wafer as shown in step 4 of FIG. 4.

Applicants have found that outgassing from the reaction of the implant ions with the photoresist is substantially prevented by the pre-ion implantation steps described above. Once the desired implant dose is achieved, the RF current and vacuum are turned off. The wafers are then unloaded.

Figure 5A:
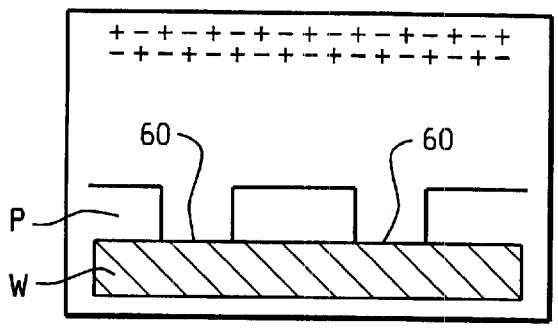
FIG. 5 is a schematic illustrating the sequence of steps for use with plasma immersion ion implantation of a method in accordance with another embodiment of the invention.
Figure 5B:
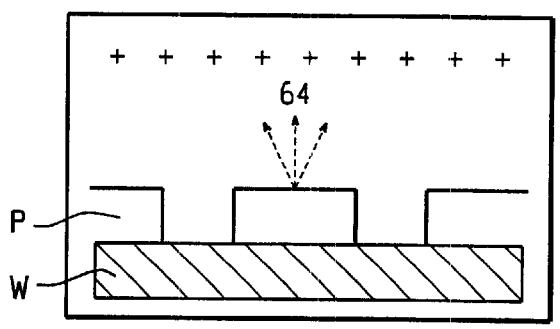
Figure 5C:
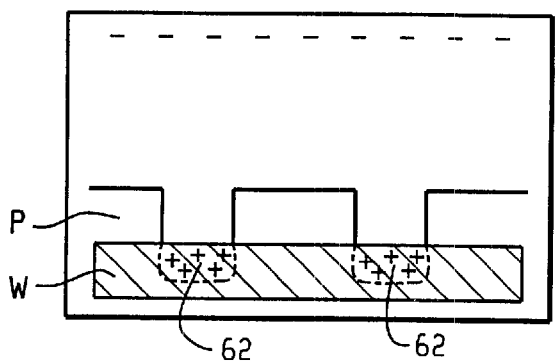

In another embodiment illustrated schematically in FIG. 5, the plasma immersion ion implantation method includes curing the photoresist P prior to the steps of ion implantation. Curing, more commonly known as hardening, is known to minimize outgassing of the photoresist during subsequent processing such as ion implantation or etching. Step 1 of FIG. 5 illustrates the step of generating the ions. The process includes the step of reversing the polarity of the platen 14 such that electrons instead of the positively charged ions are attracted to the wafer W. The electrons react with the photoresist to increase the crosslinking density as shown in step 2 of FIG. 5. The period of time for curing the photoresist is dependent on the voltage used and determination thereof is well within the skill of those in the art in view of this disclosure. The wafer is then periodically positive pulsed so as to attract and implant the positively charged ions into the exposed surface of the wafer. The hardened resist is less reactive to the positively charged implant ions and as such outgassing is insignificant or substantially eliminated. As previously described, the plasma immersion ion implanter can be configured to switch the polarity applied to the platen during operation thereof by the modulator 27. The modulator includes the mechanism for controlling the voltage applied to the wafer platen wherein the polarity voltage periodically applied during use can be switched. The curing process can performed in combination with the aforementioned processes wherein the electrons are generated by either the first or second ionized gases to react with the photoresist to effect the curing. It is contemplated by the inventors that the first step can be done independently of the implant step. In this case, electrons can be generated from a suitable source wherein the electrons are used to cure the photoresist prior to implanting with electrons. As such, the invention is not limited to the use of one chamber for the curing and implanting steps.

The foregoing description of the preferred embodiments of the invention have been presented for purposes of illustration and description. It is not intended to be exhaustive or to limit the invention to the precise forms disclosed. Obvious modifications or variations are possible in light of the above teachings. For example, the pretreatment process can be done in the same chamber as the implant process or can be separately processed in different chambers. The embodiments were chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. In a plasma immersion ion implantation process for implanting dopant ions into a surface of a substrate having an organic photoresist which forms a photoresist mask thereon, wherein said plasma immersion ion implantation process includes placing the substrate having the photoresist mask thereon into a chamber having walls of electrically conductive material, generating an implant plasma of ions from a first ionizable source wherein said ions include electrically active dopants when implanted into the substrate, and applying voltage pulses between the chamber walls and the substrate independently of the generating of the implant plasma for selectively implanting the electrically active dopant ions into the surface of the substrate, wherein the substrate is pretreated prior to the step of generating the implant plasma so as to substantially prevent implantation of carbon ions resulting from a reaction of the electrically active ions with the organic photoresist, said pretreatment process comprising the steps of:

a) generating a pretreating plasma from a second ionizable source to produce pretreatment ions that become electrically inactive when implanted in the substrate;

b) reacting the pretreatment ions with the organic photoresist to cause outgassing of an organic reactant product of said pretreatment ions and said photoresist; and c) evacuating said chamber to remove the organic reactant product.

2. The process according to claim 1 wherein the second source is a noble gas.

3. The process according to claim 2 wherein the noble gas is selected from the group consisting of argon, helium, and neon.

4. The process according to claim 1 wherein the first source is an ionizable gas and flows into the chamber 12 at a rate of about 0.5 sccm.

5. The process according to claim 1 wherein the substrate is a silicon semiconductor wafer.

6. The process according to claim 1 wherein said first ionizable source includes an implant gas selected from the group consisting of arsine, vaporized antimony, phosphine, diborane, boron trifluoride or trichloride, silicon tetrachloride, vaporized gallium, vaporized indium, ammonia, hydrogen and nitrogen.

7. The process according to claim 1 wherein said steps (b) and (c) are performed simultaneously.

8. The process according to claim 1 wherein the pretreatment process occurs in the chamber.

9. The process according to claim 1 wherein the second source flows into the chamber at a rate greater than 50 sccm.

10. A method for use with a plasma ion immersion Implanter for selectively implanting dopant ions into a surface of a substrate having an organic photoresist thereon partially covering the surface of the substrate, said method comprising the steps of:

a) placing the substrate having an organic photoresist thereon into a chamber;

b) flowing a first ionizable gas into the chamber;

c) ionizing the first gas in the chamber to produce pretreatment ions that become electrically inactive when implanted in the substrate;

d) reacting the pretreatment ions with the photoresist to produce an outgas material and continuously diluting and evacuating the outgassed material from the chamber so as to substantially prevent ionizing the outgassed material;

e) turning off the flow of the first gas;

f) flowing a second gas into the chamber;

g) ionizing the second gas in the chamber to produce electrically active dopant ions;

h) selectively implanting the electrically active dopant ions into the substrate surface;

i) turning off the second gas flow, and j) unloading the substrate from the chamber.

11. The method according to claim 10 wherein the first gas is selected from the group consisting of helium, neon and argon.

12. The method according to claim 10 wherein the electrically inactive species when implanted into the substrate is $_{40}Ar^+$.

13. The method according to claim 10 wherein the first ionizable source includes an implant gas selected from the group consisting of arsine, vaporized antimony, phosphine, diborane, boron trifluoride or trichloride, silicon tetrachloride, vaporized gallium, vaporized indium, ammonia, hydrogen and nitrogen.

14. The method according to claim 10 further comprising flowing the first gas into the chamber 12 at a rate greater than 50 sccm and flowing the second gas at a rate of about 0.5 sccm.

15. The method according to claim 10 wherein said steps (b)–(e) are completed in less than 15 seconds.

16. The method according to claim 10 further comprising monitoring an emission signal of carbon species produced during the outgassing occurring during said step (d) and turning off the first gas when the carbon emission signal is no longer detectable.

17. The method according to claim 10 wherein the electrically active ions comprise positively charged ions.

18. A method of curing photoresist for use with a plasma ion immersion implanter, said method comprising the steps of:

a) placing the substrate in an evacuated chamber;

b) ionizing a gas to produce positive ions and electrons; and c) extracting and accelerating the electrons to a surface of the substrate having the patterned photoresist for curing the photoresist by periodically pulsing a positive voltage pulse to a platen holding the substrate.

19. The method according to claim 18 further comprising extracting and accelerating only positive ions to the surface of the substrate having the patterned photoresist for doping the positive ions into the surface.

20. A method of curing photoresist and implanting ions into a surface of a substrate having an organic photoresist patterned thereon with a plasma ion immersion implanter, said method comprising:

a) placing a substrate in an evacuated chamber;

b) ionizing a gas to produce positive ions and electrons;

c) extracting and accelerating the electrons to the surface of the substrate having the patterned photoresist to cure the photoresist; and, d) extracting and accelerating the positive ions to the surface of the substrate having the patterned photoresist for doping the positive ions into the surface by periodically applying a negative voltage pulse to a platen holding the substrate.

* * * * *